United States Patent
Krivy et al.

(10) Patent No.: US 6,239,590 B1
(45) Date of Patent: May 29, 2001

(54) CALIBRATION TARGET FOR CALIBRATING SEMICONDUCTOR WAFER TEST SYSTEMS

(75) Inventors: Andrew J. Krivy, Boise; Warren M. Farnworth, Nampa; David R. Hembree, Boise; Salman Akram, Boise; James M. Wark, Boise; John O. Jacobson, Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/084,732

(22) Filed: May 26, 1998

(51) Int. Cl.[7] .................................................... G01R 1/04
(52) U.S. Cl. ....................................... 324/158.1; 324/758
(58) Field of Search .................................... 324/755, 758, 324/757, 765; 438/14, 17, 689, 688; 257/40, 48; 29/870; 33/533, 677

(56) References Cited

U.S. PATENT DOCUMENTS

| | | | |
|---|---|---|---|
| 4,918,374 | 4/1990 | Stewart et al. | 324/158 R |
| 5,004,340 | 4/1991 | Tullis et al. | 356/243 |
| 5,060,371 | 10/1991 | Stewart et al. | 29/850 |
| 5,483,741 | 1/1996 | Akram et al. | 29/846 |
| 5,508,629 | 4/1996 | Stewart et al. | 324/758 |
| 5,599,464 | 2/1997 | Laird et al. | 216/2 |
| 5,640,101 | 6/1997 | Kuji et al. | 324/754 |
| 5,656,943 | 8/1997 | Montoya et al. | 324/754 |
| 5,686,317 | 11/1997 | Akram et al. | 437/8 |
| 5,869,974 | 2/1999 | Akram et al. | . |
| 5,894,161 | 4/1999 | Akram et al. | . |
| 5,915,755 | 6/1999 | Gochnour et al. | . |
| 6,048,750 | 4/2000 | Hembree | . |
| 6,060,891 | 5/2000 | Hembree et al. | . |
| 6,072,321 | 6/2000 | Akram et al. | . |

*Primary Examiner*—Vinh P. Nguyen
(74) *Attorney, Agent, or Firm*—Stephen A. Gratton

(57) ABSTRACT

A calibration target for calibrating semiconductor wafer test systems including probe testers and probe card analyzers is provided. Also provided are calibration methods using the calibration target, and a method for fabricating the calibration target. The calibration target includes a substrate with various three dimensional alignment features formed thereon. A first type of alignment feature includes a contrast layer and an alignment fiducial formed on a tip portion thereof. The contrast layer and alignment fiducial are configured for viewing by a viewing device of the probe card analyzer, or the test system, to achieve X-direction and Y-direction calibration. A second type of alignment feature includes a conductive layer formed on a tip portion thereof, which is configured to electrically engage a contact on a check plate of the probe card analyzer, or a probe contact on a probe card of the test system, to achieve Z-direction calibration. The alignment features can be formed by forming raised members on a silicon substrate, and depositing and etching metal layers on the raised members.

28 Claims, 7 Drawing Sheets

CALIBRATION TARGET FOR CALIBRATING SEMICONDUCTOR WAFER TEST SYSTEMS

FIELD OF THE INVENTION

This invention relates to a calibration target for calibrating semiconductor wafer test systems including wafer handlers and probe card analyzers. This invention also relates to a method for fabricating the calibration target and to a test method employing the probe card.

BACKGROUND OF THE INVENTION

Semiconductor wafers are tested prior to singulation into individual dice, to assess the electrical characteristics of the integrated circuits contained on the dice. A typical wafer-level test system includes a wafer handler for handling and positioning the wafer, a tester for generating test signals, a probe card for making temporary electrical connections with the wafer, and a prober interface board for routing signals from tester pin electronics of the tester, to the probe card.

The probe card includes probe contacts adapted to make temporary electrical connections with wafer contacts on a wafer under test (WUT). Typically, the wafer contacts comprise bond pads, test pads, or fuse pads formed on the dice contained on the wafer. The most common type of probe card includes needle probes formed on a rigid substrate. Another type of probe card, known as a membrane probe card, includes metal microbumps on a flexible substrate. Yet another type of probe card includes a silicon substrate and raised probe contacts covered with conductive layers.

Because probe cards are expensive, it is advantageous to maintain probe cards by periodically assessing dimensional characteristics, such as the X,Y alignment and the planarity of the probe contacts on a probe card. Various electrical characteristics such as contact resistance of the probe contacts, and current leakage in the probe card can also be assessed. In order to evaluate these dimensional and electrical characteristics, probe card inspecting apparatus have been developed. These probe card inspecting apparatus are sometimes referred to as "probe card analyzers". U.S. Pat. Nos. 4,918,374; 5,060,371 and 5,508,629 to Stewart et al. describe probe card analyzers. In addition, probe card analyzers are commercially available from Applied Precision, Inc., Mercer Island, Wash.

For calibrating a probe card analyzer, a calibration target can be used in place of the probe cards. The calibration target includes alignment features similar in size and shape to the probe contacts. The alignment features are adapted for viewing by viewing devices associated with a check plate, or alignment system of the probe card analyzer. This permits the check plate, and a probe card chuck associated with the check plate, to be aligned in X and Y directions. Other alignment features on the calibration target can be electrically conductive to permit alignment in the Z direction upon completion of an electrical circuit. Once the probe card analyzer has been calibrated, the calibration target can be removed, and replaced with probe cards for evaluation.

In addition to calibrating probe card analyzers, calibration targets can also be used to calibrate the wafer handler of the wafer test system. For example, a wafer chuck contained on the wafer handler of the test system is constructed to move in the X and Y directions, to align the probe contacts to the wafer contacts, and in the Z direction to move the probe contacts into physical and electrical contact with the wafer contacts. A typical wafer chuck comprises a platform mounted on rails or other guiding mechanism. The platform can be moved in X, Y and Z directions by suitable linear actuators, such as a ball screw and motor, to precisely position the wafer under test with respect to the probe card. Some wafer chucks also include provision for alignment in a rotational direction (e.g., $\theta$). The wafer handler can also include an optical, or mechanical, alignment system for controlling the wafer chuck to align the wafer and probe card. For calibrating the wafer chuck and the alignment system, a calibration target can be mounted on the wafer chuck proximate to a probe card to simulate a wafer under test.

Conventional calibration targets are typically manufactured of glass, or metal, and have thick film alignment features. Stenciling is a conventional method for forming the alignment features on the calibration target. Although this type of calibration target has been used successfully in the industry, the probe contacts are becoming increasingly smaller and more densely spaced to accommodate smaller and denser wafer contacts. For example, bond pads can be about 50 microns wide on a 50 micron pitch, which is the current state of the art for wire bonding capability. As the industry progresses, smaller and denser bond pads are predicted. Accordingly, the probe contacts must correspond in size to the wafer contacts. In general, stenciled calibration targets are not able to provide the accuracy necessary to allow precision calibration of probe card analyzers and wafer test systems.

Another problem with conventional calibration targets is that printed alignment features can be damaged with continued usage. For example, an alignment feature which has been scratched, or obliterated, can be difficult to view, thus making accurate alignment difficult.

In view of the foregoing, it would be advantageous to provide a calibration target having high contrast alignment features formed with a high degree of accuracy. In addition, alignment features which are three dimensional would improve the viewability of the features, and allow calibration in the Z-direction, as well as in the X and Y directions. It would also be advantageous to provide a calibration target having alignment features that are damage resistant to permit extended use in a production environment.

SUMMARY OF THE INVENTION

In accordance with the present invention, a calibration target for calibrating wafer test systems including wafer handlers and probe card analyzers is provided. Also provided are a method for fabricating the calibration target, and calibration methods using the calibration target.

The calibration target, simply stated, comprises a substrate, and patterns of alignment features formed on the substrate. The alignment features are three dimensional raised members, or alternately three dimensional recessed members, formed integrally with the substrate. Each alignment feature is covered with a metal contrast layer, and includes one or more metal fiducials formed on a surface thereof. Preferably, either the contrast layers, or the alignment features, comprises a highly reflective metal, such as aluminum or chromium. The fiducials are adapted for viewing by a viewing device of the probe card analyzer, or of the test system, against the background provided by the contrast layers.

A first type of alignment feature comprises a pillar, or alternately an elongated ridge, having one or more fiducials thereon. A second type of alignment feature comprises a pillar having a planar surface with a dense pattern of fiducials. A third type of alignment feature includes a conductive layer rather than fiducials, and is adapted to perform z-direction and planarity calibration. The conductive layer includes a bonding pad, or alternately a conductive via, for forming an electrical path between the alignment feature and a continuity circuit. A fourth type of alignment feature comprises a recess in the substrate having a fiducial formed thereon.

A method for fabricating the calibration target includes the steps of providing the substrate (e.g., silicon), and initially blanket depositing a reflective layer (e.g., chromium, aluminum) on the substrate. A first mask (e.g., resist mask) is then formed, and used to etch the reflective layer to form contrast layers in areas that will subsequently be the surfaces of the alignment features. A second mask is then formed in order to etch the substrate to form the alignment features. Preferably, the second mask comprises a hard mask (e.g., $Si_3N_4$) having solid portions that cover the previously formed contrast layers. Using the second mask, and a suitable wet etchant (e.g., KOH), the substrate is etched to form the alignment features with a desired size and geometry. A fiducial layer (e.g., aluminum) is then blanket deposited, and a third mask is formed to permit etching of the fiducial layer to form the fiducials. Preferably, the third mask comprises a thick film resist to facilitate etching of the fiducial layer on the raised topography of the alignment features.

A method for calibrating a test system using the calibration target includes the initial step of viewing the fiducials on the alignment features. Using this information, the calibration target (or alternately a check plate on a probe card analyzer of the test system, or a probe card on the test system) can be moved in X, Y and θ directions to align the fiducials with corresponding features on the check plate, or on the probe card. Next, the calibration target (or alternately the check plate or the probe card) can be moved in the z-direction to make physical contact and electrical connections between the conductive layers and corresponding features on the check plate, or on the probe card. Rather than making physical contact, a no contact method can be employed wherein electrical capacitance between the conductive layers and a planar calibration plate is measured.

In an alternate embodiment calibration method, the calibration target can be used to calibrate a probe card in six degrees of freedom (e.g., X, Y, Z, θ, φ, Ψ)

DETAILED DESCRIPTION OF THE PREFERRED EMBODIMENTS

Figure 1:
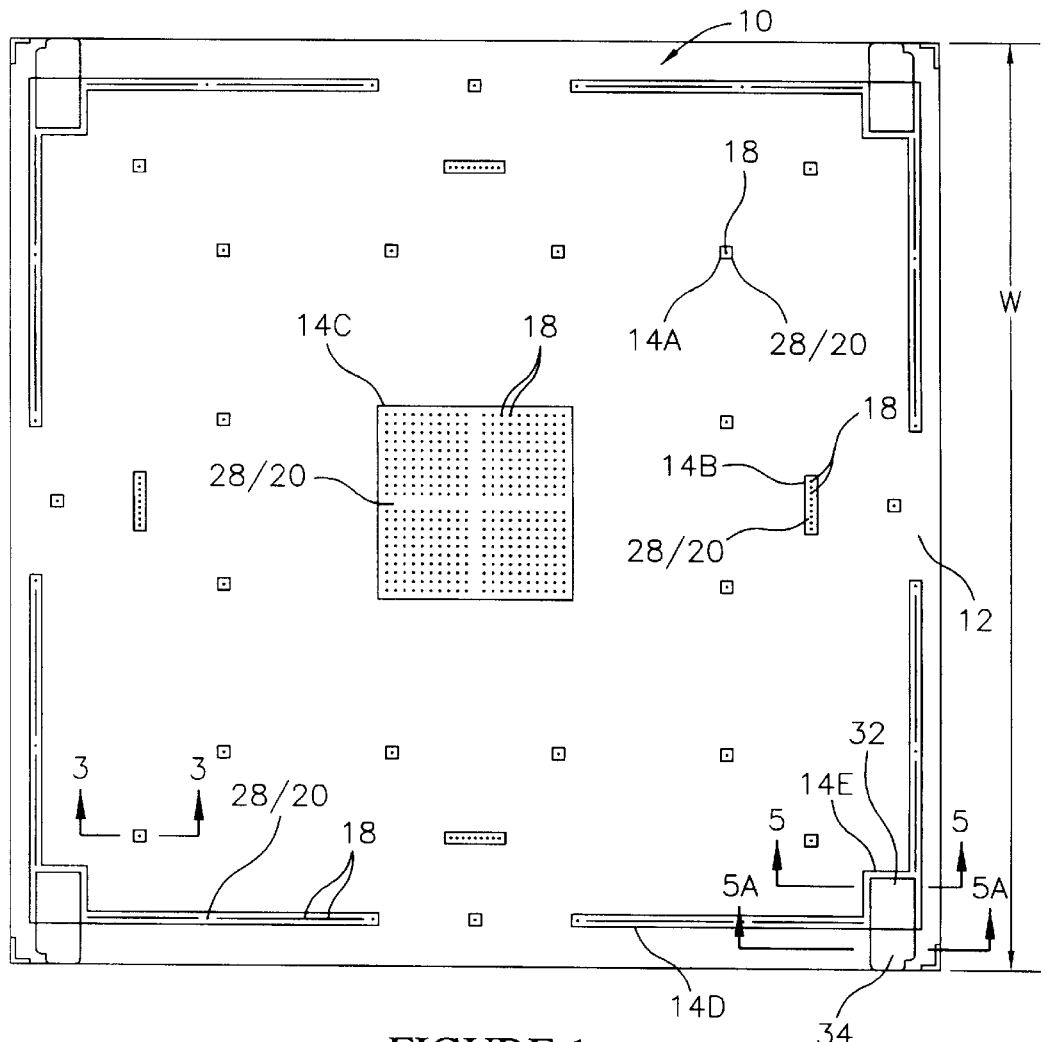
FIG. 1 is an enlarged plan view of a calibration target constructed in accordance with the invention.

Referring to FIG. 1, a calibration target 10 constructed in accordance with the invention is illustrated. The calibration target 10 includes a substrate 12, and a plurality of alignment features 14A, 14B, 14C, 14D, 14E formed on the substrate 12. The alignment features 14A, 14B, 14C, 14D, 14E are formed on different portions of a surface 16 of the substrate 12. The alignment features 14A, 14B, 14C, 14D (except alignment feature 14E) include contrast layers 20 and transparent mask layers 28. In addition, one or more alignment fiducials 18 are formed on the mask layers 28.

Figure 7:
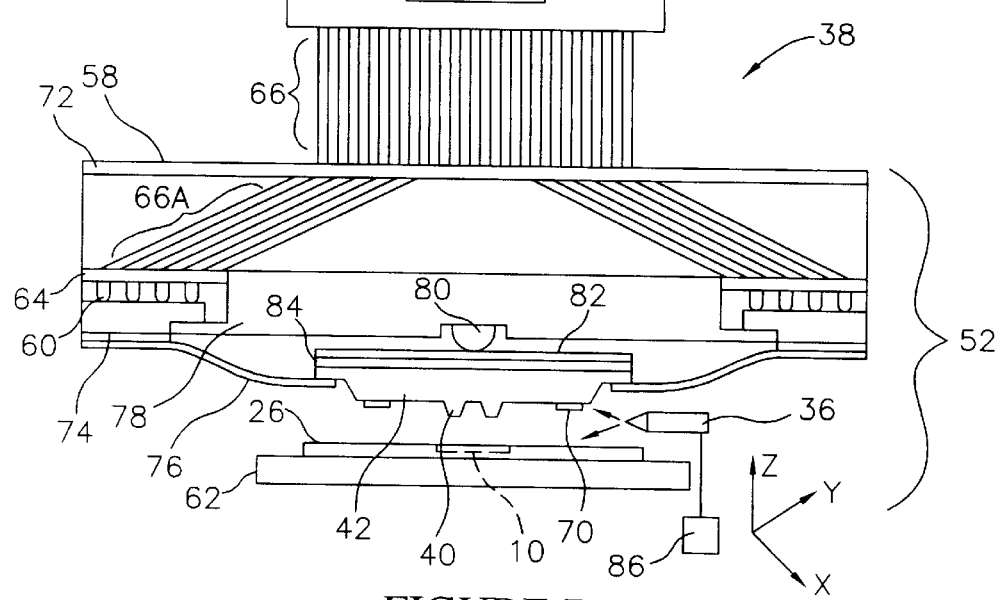
FIG. 7 is a schematic drawing of a semiconductor wafer test system and the calibration target.

As will be further explained, the calibration target 10 can be used to calibrate a semiconductor wafer test system 38 (FIG. 7). The calibration target 10 can also be used to calibrate a probe card analyzer 39 (FIG. 8) of the test system 38. For performing the calibration procedures, the alignment fiducials 18 are constructed for viewing by viewing devices of the wafer test system 38 or the probe card analyzer 39.

In the illustrative embodiment, the substrate 12 of the calibration target 10 comprises a silicon material, such as monocrystalline silicon, silicon-on-glass, or silicon-on-sapphire. With the substrate 12 formed of silicon, a coefficient of thermal expansion (CTE) of the calibration target 10 is the same as the CTE of a wafer under test. In addition, with the substrate 12 formed of silicon, an etching procedure, as will be hereinafter described, can be used to form the alignment features 14A, 14B, 14C, 14D, and 14E. However, the substrate 12 can also be another semiconductor material, such as germanium, or a low CTE material, such as ceramic.

Figure 2:
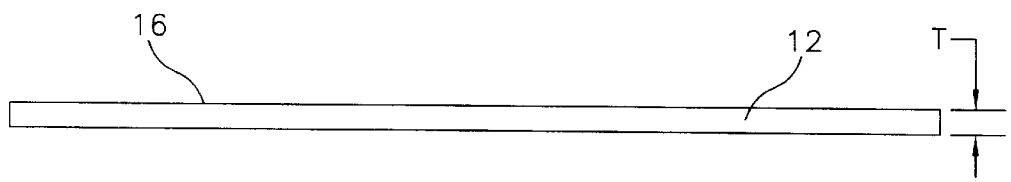
FIG. 2 is a side view of FIG. 1.
Figure 6:
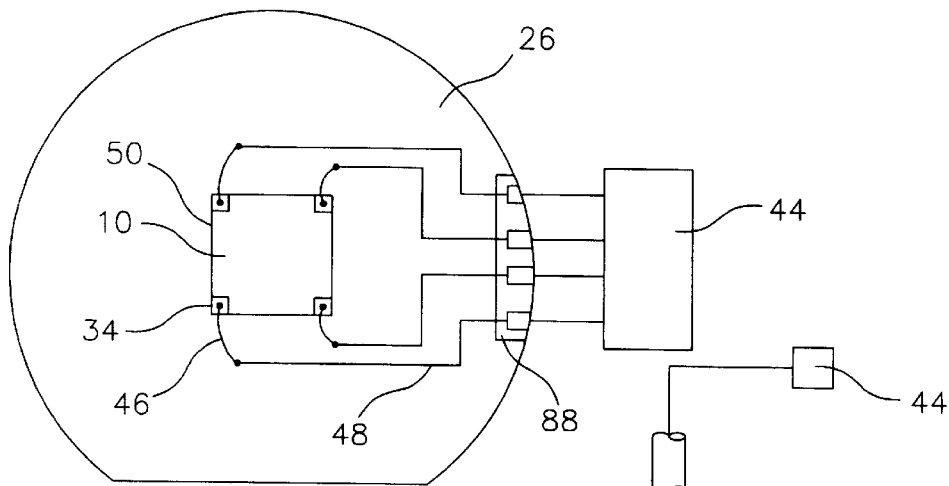
FIG. 6 is a schematic plan view of a fixture configured to retain the calibration target and illustrating electrical connection a continuity circuit using wire bonds.

In the illustrative embodiment the calibration target 10 has a generally square peripheral configuration. As will be further explained, the calibration target 10 is designed for placement in a mounting fixture 26 (FIG. 6). The calibration target 10 has a width "W" (FIG. 1) on each side, and a thickness "T" (FIG. 2). By way of example, a representative width "W" can be from about 15 mm to 21 mm or greater. A representative thickness "T" can be from 10 mils to 80 mils. Since the height of the alignment features 14A, 14B, 14C, 14D, 14E is small relative to a thickness "T" of the calibration target 10, the alignment features 14A, 14B, 14C, 14D, 14E are not shown in the side elevation view of FIG. 2.

Figure 3:
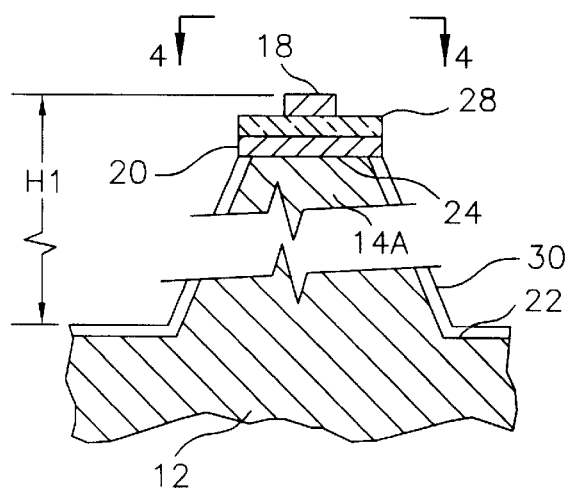
FIG. 3 is an enlarged cross sectional view taken along section line 3—3 of FIG. 1.

Referring to FIG. 3, one of the alignment features 14A is illustrated in an enlarged cross sectional view. As will be further explained, the alignment features 14A can be formed integrally with the substrate 12 using an etching process. The alignment features 14A comprise generally pyramidal shaped pillars having base portions 22 and tip portions 24. The tip portions 24 of the alignment features 14A include the contrast layers 20, the mask layers 28, and the alignment fiducials 18. As will be further explained, the mask layers 28, are portions of a hard mask used to etch the substrate 12 to form the alignment features 14A. Preferably, the mask layers 28 are formed of a transparent or translucent material such that the contrast layers 20 are viewable through the mask layers 28. The substrate 12 also includes an insulating layer 30 for electrically isolating the alignment features 14A from a bulk of the substrate 12.

Figure 4C:
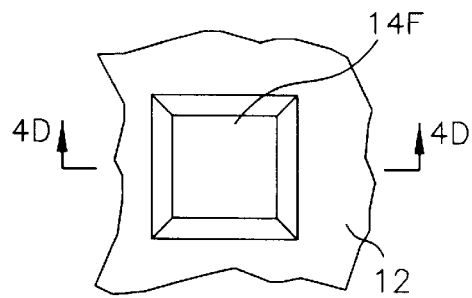
FIG. 4C is a plan view equivalent to FIG. 4 of another alternate embodiment alignment fiducial.
Figure 4:
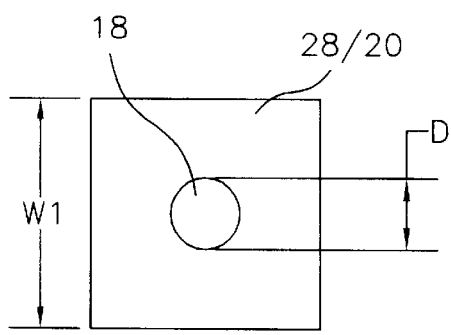
FIGS. 4—4A are a plan view taken along section line 4—4 of FIG. 3 illustrating an alignment fiducial.

As shown in FIG. 4, the alignment fiducials 18 have a generally circular peripheral configuration. Alternately, as shown in FIG. 4A, alternate embodiment alignment fiducials 18A have a cross shaped peripheral configuration. As shown in FIG. 4C, alternate embodiment alignment fiducials 18B have a square peripheral configuration.

By way of example, a representative height H1 of the alignment features 14A can be from 10 μm to 150 μm. A representative width W1 (and length) of the alignment features 14A can be from 10 μm to 150 μm. The alignment fiducials 18 are preferably smaller than the width W1 of the alignment features 14A, such that the contrast layers 20 provide a background for viewing the alignment fiducials 18. A representative diameter D (FIG. 4) of the alignment fiducials can be from 10 μm to 50 μm.

Referring again to FIG. 1, alignment features 14B are substantially similar in construction to alignment features 14A, but are elongated ridges rather than pillars, having a length of up to several mm or more. In addition, the alignment features 14B include multiple alignment fiducials 18 in a linear pattern.

Still referring to FIG. 1, alignment features 14C are also substantially similar in construction to alignment features 14A but are larger in area. In addition, alignment features 14C include multiple alignment fiducials 18 formed in a dense array pattern. Alignment features 14D are also substantially similar in construction to alignment features 14A, but are elongated ridges formed along a periphery of the calibration target 10. In addition, alignment features 14D include multiple alignment fiducials formed in a linear pattern.

Figure 4D:
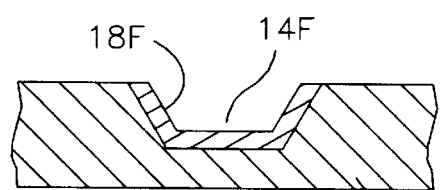
FIG. 4D is a cross sectional view taken along section line 4D—4D of FIG. 4C.
Figure 4A:
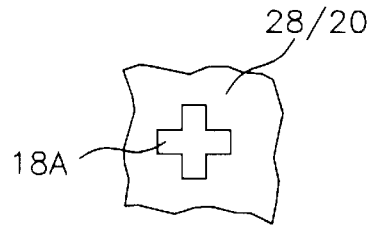

Referring to FIGS. 4C and 4D, an alternate embodiment alignment feature 14F is illustrated. Alignment feature 14F comprises a recess or indentation etched into the substrate 12 and covered with an alignment fiducial 18F. In this embodiment the alignment fiducial 18F can comprise a polymer material, such as polyimide, which has been deposited into the alignment feature 14F to provide contrast with the substrate 12.

Figure 5:
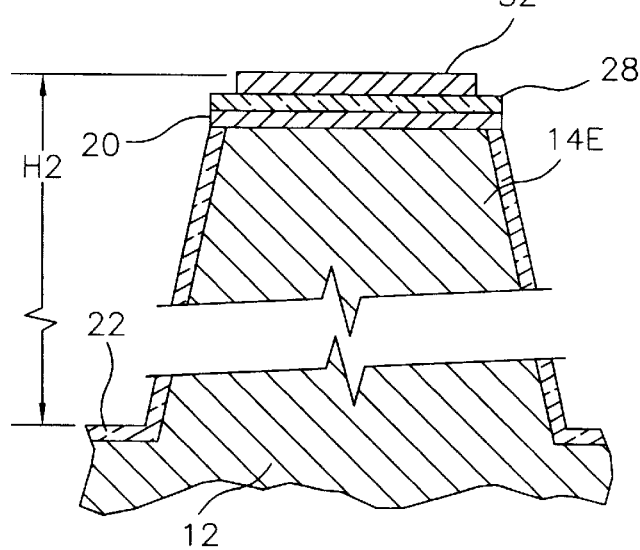
FIG. 5 is an enlarged cross sectional view taken along section line 5—5 of FIG. 1.
Figure 5A:
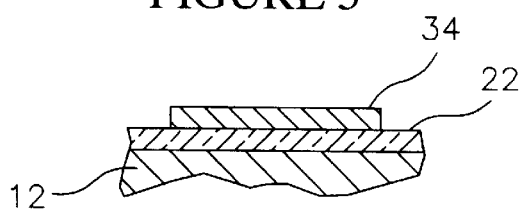
FIG. 5A is an enlarged cross sectional view taken along section line 5A—5A of FIG. 1.

Referring to FIG. 5, one of the alignment features 14E is illustrated in an enlarged cross sectional view. The alignment features 14E comprise raised pillars substantially as previously described for alignment features 14E. There are four alignment features 14E located at the corners of the calibration target 10. The alignment features 14E include mask layers 28 and contrast layers 20. In addition, the alignment features 14E include conductive layers 32 in electrical communication with bond pads 34 (FIG. 5A).

As will be further explained, alignment features 14E are constructed to perform Z-direction and planarity calibration of the test system 38 (FIG. 7). To perform these functions, conductive layers 32 on alignment features 14E can be used to electrically contact selected probe contacts 40 (FIG. 7) on a probe card 42 (FIG. 7) of the test system 38 (FIG. 7). In addition, wires 46 (FIG. 6) can be wire bonded to the bond pads 34A and to corresponding conductors 48 (FIG. 6) on the mounting fixture 26 (FIG. 6) to provide electrical paths between the conductive layers 32 and a continuity circuit 44 (FIG. 6). In order to insure that the conductive layers 32 touch the probe contacts 40 (FIG. 7) prior to the alignment fiducials 18 (FIG. 3), a height H2 of alignment features 14E can be slightly greater than a height H1 of alignment features 14A (FIG. 3). Alternately, as will be subsequently explained, the alignment features 14E, rather than touching the probe contacts 40, can be used with a capacitance meter 35 (FIG. 7B) to measure capacitance to perform Z-direction and planarity calibration. As will also be further explained, the alignment features 14E can be used to calibrate the alignment and planarity of a probe card analyzer check plate 47 (FIG. 7B).

Figure 8:
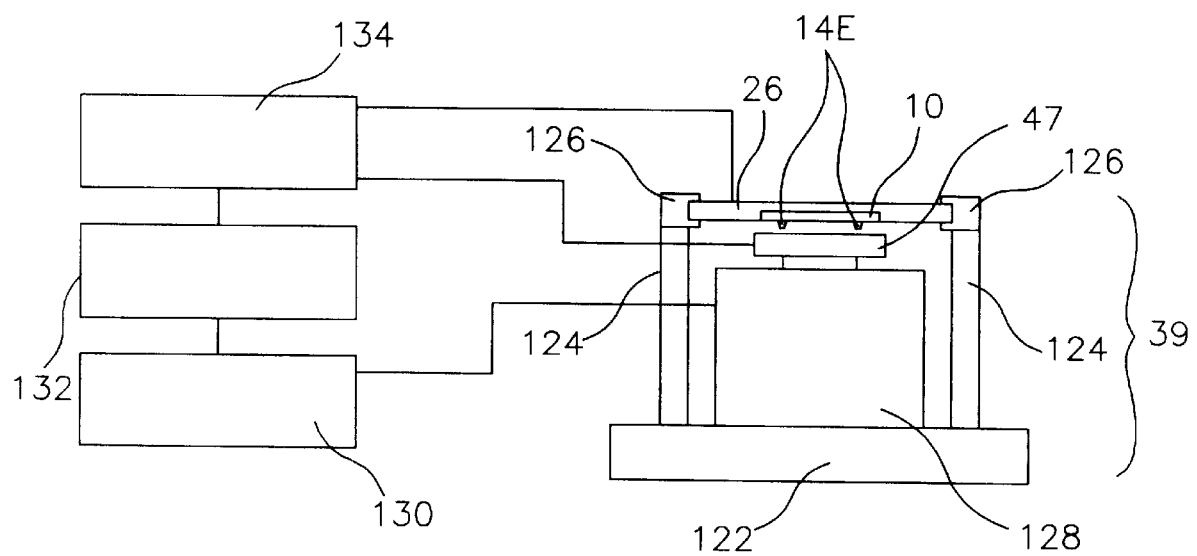
FIG. 8 is a schematic diagram of a probe card analyzer and the calibration target.

Referring to FIG. 6, the calibration target 10 is designed to be placed in the mounting fixture 26 to perform calibration of the wafer test system 38 (or alternately of the probe card analyzer 39—FIG. 8 of the test system 38). The mounting fixture 26 can be formed of glass or other electrically insulating material that can be shaped or machined with tight dimensional and planarity tolerances. The mounting fixture 26 includes a square opening 50 sized to receive the calibration target 10. In the illustrative embodiment, the mounting fixture 26 has a size and peripheral configuration similar to that of a semiconductor wafer. However, other peripheral configurations such as square or rectangular can also be provided for the mounting fixture 26. In addition, the mounting fixture 26 can include an electrical connector 88 designed for interface with a mating electrical system such as the continuity circuit 44. Still further, the mounting fixture 26 can be designed to provide clearance for the wires 46 such that they do not interfere with the calibration process.

Figure 6A:
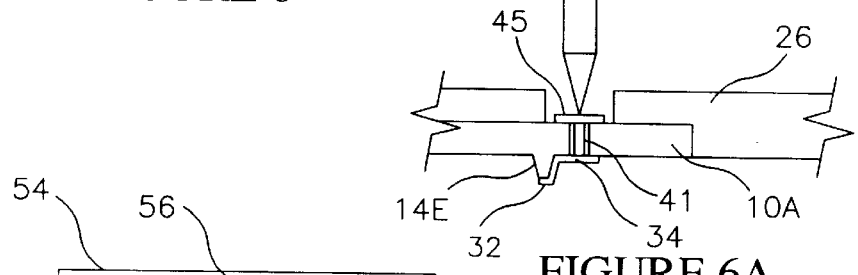
FIG. 6A is a schematic cross sectional view of an alternate embodiment calibration target having a conductive via illustrating electrical connection to the continuity circuit using spring loaded electrical connectors.

Alternately, rather than bonding wires 46 to provide electrical paths between the calibration target 10 and continuity circuit 44, other electrical connectors can be employed. FIG. 6A illustrates an alternate embodiment calibration target 10A having conductive vias 41 in electrical communication with the bond pads 34 and the conductive layers 32 of the alignment features 14E. The conductive vias 41 include contacts 45 formed on a backside of the calibration target 10A. The contacts 45 are adapted for electrical engagement with spring loaded electrical connectors 43 mounted to the test fixture 38 (FIG. 7) in electrical communication with the continuity circuit 44. By way of example, the spring loaded electrical connectors 43 can comprise "POGO PINS" manufactured by Pogo Industries, Kansas City, Kans.

The conductive vias 41 can be fabricated by forming openings through the calibration target 10 then insulating and filling the openings with a metal or conductive polymer. U.S. patent application Ser. No. 08/993,965 entitled "Semiconductor Interconnect Having Laser Machined Contacts", incorporated herein by reference, describes a method for fabricating the conductive vias 41.

Referring to FIG. 7, the test system 38 is shown. The test system 38 is adapted to test semiconductor wafers (not shown). The test system 38 includes a wafer handler 52 with a test head 58 wherein the probe card 42 is mounted. The test system 38 also includes the probe card analyzer 39 (FIG. 8) that is located separately with respect to the wafer handler 52.

The wafer handler 52 of the test system 38 includes a wafer chuck 62. The wafer chuck 62 is configured to move in X and Y directions to align the wafers under test with the probe card 42, and in the Z direction to move the wafers into contact with the probe card 42. One suitable wafer handler 52 is manufactured by Electroglass and is designated a Model 4080. For calibrating the test system 38, the mounting fixture 26 with the calibration target 10 mounted thereto, is placed on the wafer chuck 62.

The probe card 42 of the test system 38 includes probe contacts 40 constructed to make temporary electrical connections with corresponding wafer contacts (not shown) on a wafer under test. Briefly, the probe card 42 includes a silicon substrate having the probe contacts 40 formed thereon as etched members covered with conductive layers. Further details of the probe card 42 are disclosed in U.S. patent application Ser. No. 08/770,942 now U.S. Pat. No. 5,952,840 entitled "METHOD, APPARATUS AND SYSTEM FOR WAFER LEVEL TESTING SEMICONDUCTOR DICE", which is incorporated herein by reference. However, it is to be understood that the calibration target 10 and calibration method of the invention can also be used with conventional probe cards such as a needle probe cards and membrane probe cards. During the calibration procedure the alignment features 14A, 14B, 14C, 14D on the calibration target 10 can be aligned with probe contacts 40, or with dedicated alignment features 70 on the probe card 42.

Still referring to FIG. 7, the test system 38 also includes a tester 54 having test circuitry 56 adapted to apply test signals through electrical paths 66 to tester pin electronics 72 within the test head 58. The test head 58 includes electrical paths 66A from the tester pin electronics 72 to a prober interface board 64. The prober interface board 64 includes spring loaded electrical connectors 60, such as "POGO PINS", configured to electrically contact a probe card holder 74. The probe card 42 is physically and electrically connected to the probe card holder 74 using a flexible membrane 76 similar to conventional TAB tape. The test head 58 also includes a force applying fixture 78 having a force applying member 80. The force applying member 80 transfers force through a pressure plate 82 and an elastomeric cushioning member 84 to the probe card 42.

The test system 38 also includes the viewing device 36 which is constructed to view the surface of the probe card 42 and the surface of the calibration target 10. The viewing device 36 is in signal communication with an alignment system 86 which is constructed to move the wafer chuck 62 in X, Y and Z directions based upon input from the viewing device 36. A representative alignment system is described in U.S. Pat. No. 5,640,101, entitled "PROBE SYSTEM AND PROBE METHOD".

Figure 4B:
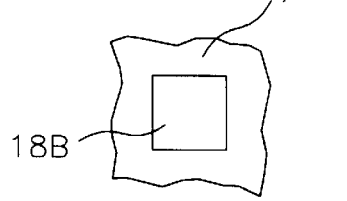
FIG. 4B is a plan view equivalent to FIG. 4 of an alternate embodiment alignment fiducial.
Figure 7A:
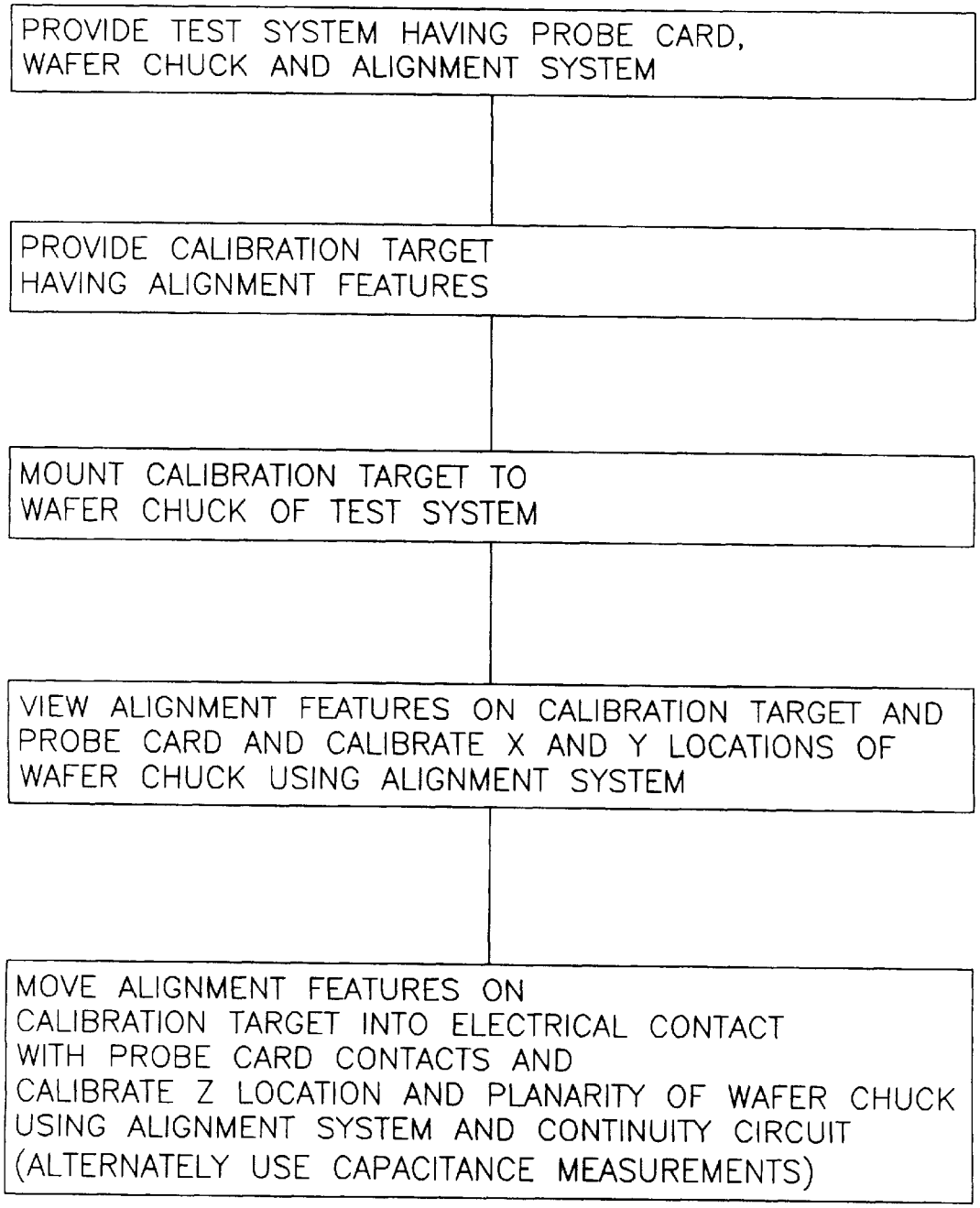
FIG. 7A is a block diagram of steps in a method for calibrating the test system of FIG. 7 using the calibration target.
Figure 7B:
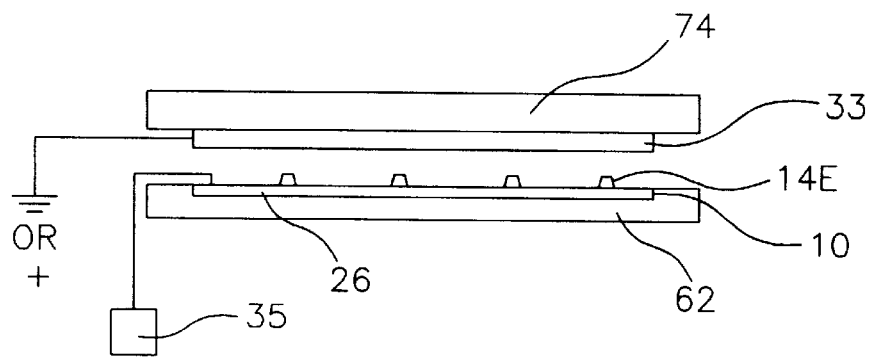
FIG. 7B is a schematic diagram illustrating an alternate embodiment method for calibrating the test system of FIG. 7 using the calibration target.

Referring to FIG. 7A, broad steps in a method for calibrating the test system 38 using the method of the invention are shown.
1. Provide test system having probe card 42, wafer chuck 62 and alignment system 86 for wafer chuck 62. The test system 38 shown in FIG. 7 is one example but other conventional test system can be employed. In addition, the probe card can be the probe card 40 of FIG. 7 having raised probe contacts 40, or a conventional needle or membrane probe card.
2. Provide calibration target 10 having alignment features. The calibration target 10 includes alignment features 14A, 14B, 14C, 14D (FIG. 1) having fiducials 18 adapted for viewing by a viewing device 36 (FIG. 7) of the alignment system 86. In addition, the calibration target 10 includes alignment features 14E which are adapted to perform Z direction and planarity calibration.
3. Mount calibration target to wafer chuck 62 of test system. In FIG. 7, the calibration target 10 is mounted to a mounting fixture 26, which is placed on the wafer chuck 62 in place of a wafer under test.
4. View alignment features on calibration target 10 and probe card 42 and calibrate the X and Y locations of wafer chuck 62 using alignment system 86. The alignment features on the probe card 42 (FIG. 7) can be probe contacts 40, or dedicated alignment features 70 on the probe card 42. In addition, if the alignment system 86 includes rotational calibration capabilities, a rotational orientation (θ) of wafer chuck 62 can be calibrated. Alignment fiducials 18A (FIG. 4A) or 18B (FIG. 4B) can be used to verify rotational orientation.
5. Move alignment features on calibration target 10 into electrical contact with probe card contacts 40 and calibrate Z location and planarity of wafer chuck 62 using alignment system 86. The alignment features 14E (FIG. 5) are adapted to electrically contact selected probe contacts 40 (FIG. 7) on the probe card 42. The continuity circuit 44 (FIG. 6) can be used to verify that the alignment features 14E and probe contacts 40 are in physical and electrical contact. This spaces the calibration target 10 from the probe card 42 by a distance equal to a height H2 (FIG. 5) of the alignment features 14E. Using this information the Z direction location of the wafer chuck 62 (FIG. 7) with respect to the probe card 42 can be ascertained.

Also, with the alignment features 14E on the calibration target 10 in electrical contact with probe card contacts 40, the planarity of wafer chuck 62 with respect to the probe card 42 can be calibrated. In this case, the four alignment features 14E (FIG. 1) can be used in combination to evaluate the planarity of the probe card 42 with respect to the wafer chuck 62. For example, if one or more of the alignment features 14E are not touching the probe card contacts 40, then the planarity of the wafer chuck 62 can be adjusted so that all four alignment features 14E are in physical and electrical contact with the probe card contacts 40. In order to perform planarity calibration, the alignment system 86 must have the capability to move the wafer chuck 62 (or alternately the probe card 42) in six degrees of freedom (X, Y, Z, θ, φ, Ψ).

Alternately, rather than using electrical continuity to calibrate the Z direction location and planarity of the wafer chuck 62, capacitance measurements can be employed. FIG. 7B illustrates calibration using capacitance measurements. In FIG. 7B, the probe card 42 (FIG. 7) has been replaced with a planar calibration plate 33. The calibration plate 33 can be mounted to the probe card holder 74 and electrically connected to ground (or alternately to a positive potential). In addition, the mounting fixture 26 can be mounted to the wafer chuck 62 with the alignment features 14E in electrical communication with a capacitance meter 35. Electrical communication between the alignment features 14E and capacitance meter 35 can be as shown in FIG. 6 or 6A. In some systems the wafer chuck 62 can provide an electrical path to the calibration target 10.

Using capacitance measurements physical contact between the alignment features 14E and calibration plate 33 is not required. Rather, the alignment features 14E and calibration plate 33 can be placed in close proximity, and the capacitance can be measured between each alignment feature 14E and the calibration plate 33. Using these capacitance measurements, and the location of the alignment features 14E on the calibration target 10, the planarity of the wafer chuck 62 can be ascertained and calibrated.

Referring to FIG. 8, the calibration target 10 can be used to calibrate the probe card analyzer 39 of the test system 38. In the illustrative embodiment the probe card analyzer 39 is manufactured by Applied Precision, Inc., Mercer Island, Wash. under the trademark "PRECISION POINT VX".

The probe card analyzer 39 includes a base 122 having supports 124 for probe card holders 126. The mounting fixture 26 and calibration target 10 can be mounted to the probe card holders 126. The probe card analyzer 39 also includes an X, Y, Z table 128 on which the check plate 47 is mounted. The table 128 is in signal communication with table control circuitry 130 and a computer 132. In addition, the check plate 47 is in signal communication with measuring circuitry 134 and the computer 132. The calibration target 10 can also be in signal communication with the measuring circuitry 134 and the computer 132. The measuring circuitry 134 can include a continuity circuit as previously described.

Further, the check plate 47 can include optical viewing devices for viewing the alignment fiducials 18 on the calibration target 10, substantially as previously described. Using information from the viewing devices and the table control circuitry 130, and by moving the X, Y, Z table 128 and check plate 47, the X and Y locations of the check plate 47 can be calibrated. The check plate 47 can also include contacts configured for mating physical and electrical engagement with the conductive layers 32 of the alignment features 14E, substantially as previously described. Using the alignment features 14E and the measuring circuitry 134, and by moving the check plate 47 as required with the X, Y, Z table 128, the Z-direction location and planarity of the check plate 47 can be calibrated, substantially as previously described.

Figure 9:
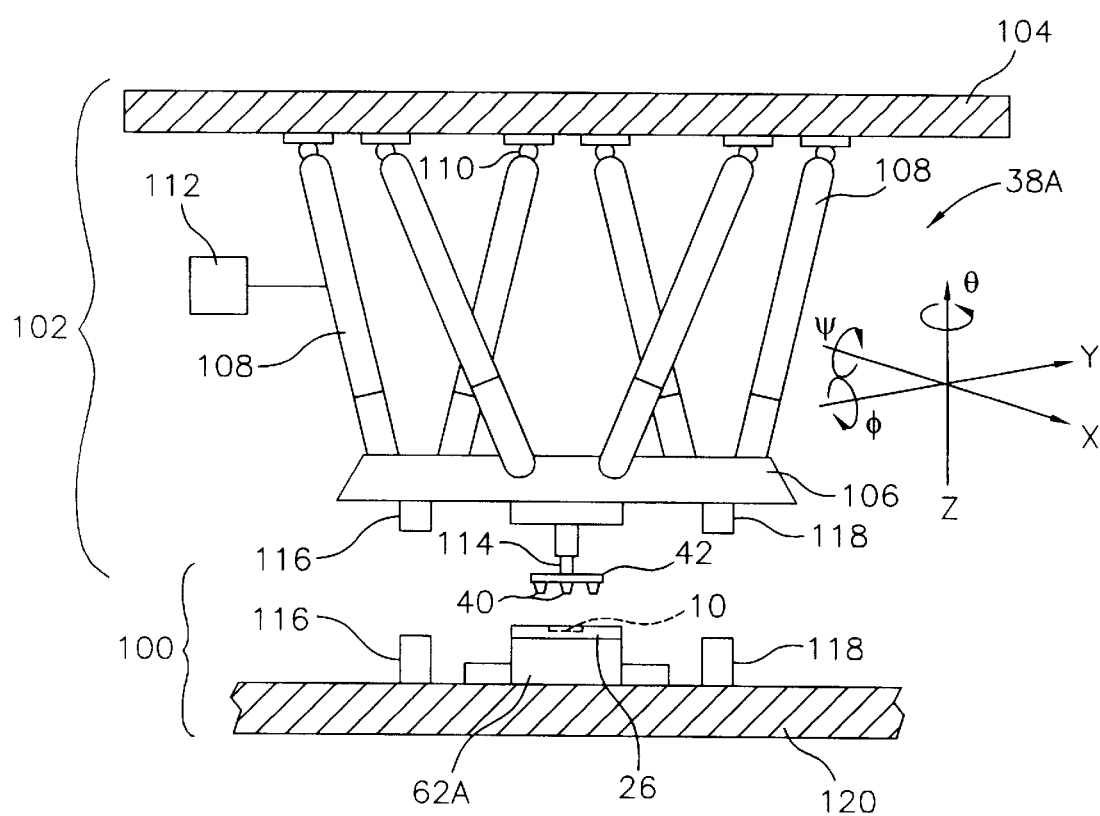
FIG. 9 is a schematic drawing of an alternate embodiment semiconductor wafer test system and the calibration target.

Referring to FIG. 9, an alternate embodiment test system 38A can be provided to perform the optional alignment in six degrees of freedom. The test system 38A includes a platform assembly 102 and a chuck assembly 100. The platform assembly 102 is able to move the component probe card 42 in six degrees of freedom, namely three translational degrees of freedom (X, Y, Z) and three rotational degrees of freedom ($\theta$, $\phi$, $\Psi$). The degrees of freedom can be according to conventional definitions wherein the X-axis and Y-axis are orthogonal and co-planar, and the Z-axis is contained in a plane orthogonal to the plane of the X-axis and Y-axis. As is also conventional, $\theta$ can be angular rotation about the Z-axis, $\phi$ can be angular rotation about the Y-axis, and $\Psi$ can be angular rotation about the X-axis. The three rotational degrees of freedom are also sometimes referred to as pitch, yaw and roll.

In order to allow movement, in six degrees of freedom, with high precision, the platform assembly 102 comprises a hexapod, or Stewart platform. The platform assembly 102 includes a fixed platform 104 and a moving platform 106. The moving platform 106 is connected to the fixed platform 104 by a plurality of linear actuators 108. The linear actuators 108 are preferably connected to the fixed platform 104 and to the moving platform 106 by universal ball joints 110 at each end thereof. In addition, the linear actuators 108 are preferably controlled by a controller 112 such as a computer controller, or a central processing unit (CPU). In general, the controller 112 must possess sufficient computing power to precisely control the six linear actuators 108.

The platform assembly 106 also includes a holding mechanism 114 attached to the moving platform 106 for holding the probe card 42. The holding mechanism 114 is configured to hold the probe card 42 for movement with the moving platform 106. The chuck assembly 100 includes a wafer chuck 62A which holds the mounting fixture 26, and calibration target 10 in a fixed position and orientation.

Still referring to FIG. 9, the position and orientation of the calibration target 10 is evaluated through the use of a height gauge 116 and a camera 118 mounted on the moving platform 106. While a laser height gauge is preferred, other distance measuring devices such as an interferometer can also be employed. The height gauge 116 and camera 118 are in signal communication with the controller 112 which operates the linear actuators 108. The height gauge 116 and camera 118 generate electronic signals which are transmitted to the controller 112. The controller 112 is configured to receive and analyze the signals and to operate the linear actuators 108 in response to the signals.

During the calibration process, the moving platform 106 can be moved such that the height gauge 116 is proximate to the substrate calibration target 10, and is able to determine the distance between the height gauge 116 and the calibration target 10. This distance information can be converted into a signal, which can be optically or electrically transmitted to the controller 112. The distance information gives a Z-axis coordinate for the calibration target.

Similarly, the moving platform 106 can be moved such that the camera 118 is proximate to the calibration target 10 and can generate an image of the alignment fiducials 18 on the alignment features 14A. The visual image can be used to identify three reference points X1, X2, X3. This image can then be converted into a signal which can be optically or electrically transmitted to the controller 112. By noting the X-axis and Y-axis coordinates of the reference points X1, X2, X3, and the Z-axis coordinate obtained by the height gauge 116, the position and orientation of the plane containing the reference points can be determined.

The position and orientation of the probe card 42 can be determined in a similar manner. Specifically, a camera 118 and a height gauge 116 are mounted on a base 120 of the chuck assembly 100. Operation of the platform assembly 102 allows the probe card 42 to be placed proximate to the height gauge 116 to determine distance information and the Z-axis coordinate of the probe card 42. Similarly, the probe card 42 can be placed proximate to the camera 118, and a visual image can then be obtained and communicated to the controller 112. The visual image can be used to identify the X-axis and Y-axis coordinates of at least three points Y1, Y2, Y3 (FIG. 3) on the probe card 42. Again the three points can be features such as the probe contacts 40 or can be dedicated alignment fiducials. Using this information and the Z-axis coordinate from the height gauge 116, the orientation and position of the component probe card 42 can be calculated.

Also using the above information, the controller 112 can operate the linear actuators 108 to calibrate in the X and Y directions, and to calibrate the parallelism of the probe card 42 and wafer chuck 62A. The probe card 42 and wafer chuck 62A can thus be calibrated in five degrees of freedom (i.e., X, Y and three rotational degrees). In addition, the controller 112 can operate the linear actuators 108 to move the moving platform 106 with a Z-axis component, while maintaining parallelism and X-Y alignment, until contact is achieved between the alignment features 14E and probe contacts 42 as previously described. This provides calibration in the sixth degree of freedom. As is apparent, calibration in six degrees of freedom can be a continuous process, or can be performed in stages.

Referring to FIGS. 10A–10D, steps in a method for fabricating alignment features 14A and 14E of the calibration target 10 are illustrated. Although only alignment features 14A and 14E are shown in FIGS. 10A–10D, the fabrication of alignment features 14B, 14C and 14D (FIG. 1) is substantially similar to the fabrication of alignment feature 14A. Also in the fabrication method illustrated in FIGS. 10A–10D, the substrate 12 comprises monocrystalline silicon.

Figure 10A:
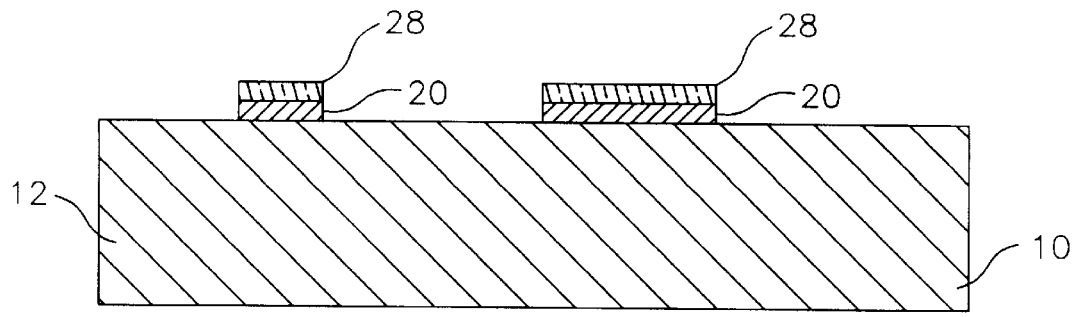
FIGS. 10A–10D are schematic cross sectional views illustrating steps in a method for fabricating the calibration target.

Initially, as shown in FIG. 10A, the contrast layers 20 can be formed on the substrate 12. A metallization process such as blanket deposition of a thin film metal (e.g., CVD, sputtering, evaporation), and wet etching through a first resist mask (not shown) can be used to form the contrast layers 20. The size, shape and pattern of openings in the first resist mask will determine the size, shape and pattern of the contrast layers 20. Preferably the contrast layers 20 comprise a highly reflective metal such as aluminum or chromium. A representative thickness of the contrast layers 20 can be from 500 Å to 3000 Å.

As also shown in FIG. 10A, the mask layers 28 can be formed on the contrast layers 20. The mask layers 28 will be used to etch the substrate 12 to form the raised alignment features 14A, 14E. The mask layers 28 can be formed by blanket depositing a transparent or translucent material, such as silicon nitride ($Si_3N_4$), using a process such as CVD. A second resist mask (not shown) can then be used to etch the blanket deposited material to form the mask layers 28. A dry etch process with a suitable etchant species can be used to form the mask layers 28. A representative thickness of the mask layers 28 can be from 500 Å to 3000 Å.

Figure 10B:
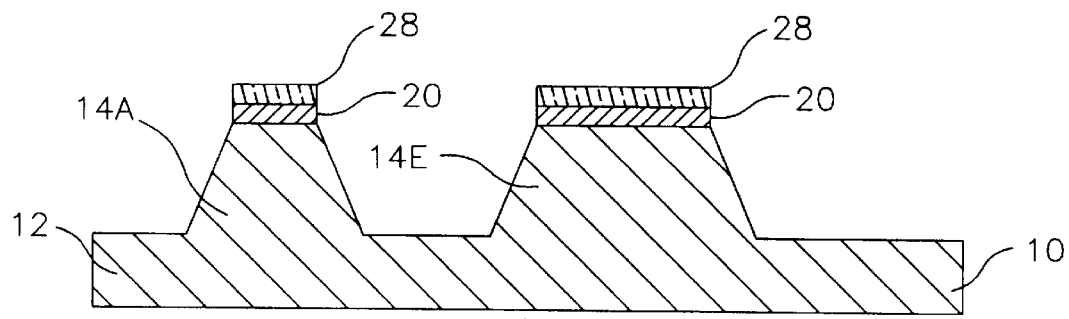

Next, as shown in FIG. 10B, the mask layers 28 can be used to etch the substrate 12 to form the alignment features 14A, 14E. A micromachining process using a wet etchant, such as KOH, can be used to etch the substrate 12. Such an etch process is referred to as anisotropic, and forms the alignment features 14A, 14F with sidewalls that are sloped at an angle of about 54° with respect to the surface of the substrate 12. The alignment features 14A, 14E are thus generally pyramidal in cross section with flat tip portions. A representative height of the alignment features 14A, 14E can be from 50 $\mu$m to 150 $\mu$m. A width and length of the alignment features 14A, 14E can be from 50 $\mu$m to several mm or more. Alignment features 14B, 14C, 14D can be etched at the same time as alignment features 14A, 14E, but their mask layers 28 will be sized differently than the mask layers 28 for alignment features 14A, 14E.

Figure 10C:
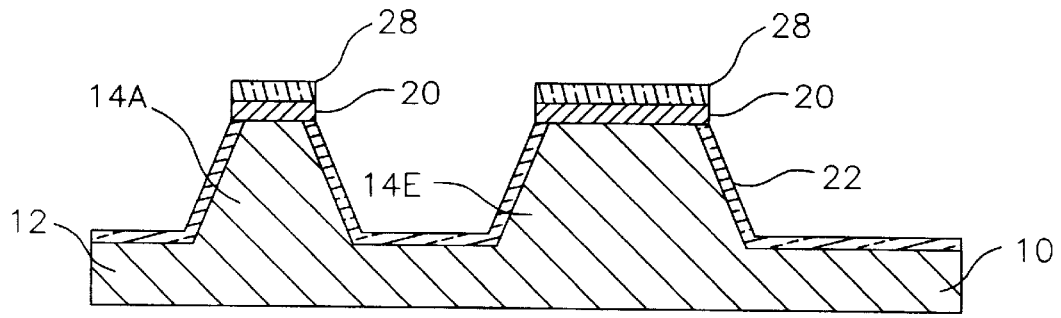

Next, as shown in FIG. 10C, the insulating layer 22 can be formed on the exposed surfaces of the substrate 12. In general, the insulating layer 22 functions to electrically isolate a bulk of the substrate from the alignment features 14A, 14B, 14C, 14D, 14E. The insulating layer 22 can comprise an oxide, such as $SiO_2$, or an elastomeric material, such as polyimide. For example, a layer of $SiO_2$ can be grown by exposing the substrate 12 to an oxidizing atmosphere in a reaction chamber. As another example, TEOS (tetraethylorthosilane) can be injected into a reaction chamber to grow $SiO_2$ at a temperature of about 400° C. The insulating layer 22 can also comprise $Si_3N_4$ deposited using a CVD process. A representative thickness of the insulating layer 22 can be from 500 Å to 6000 Å.

Figure 10D:
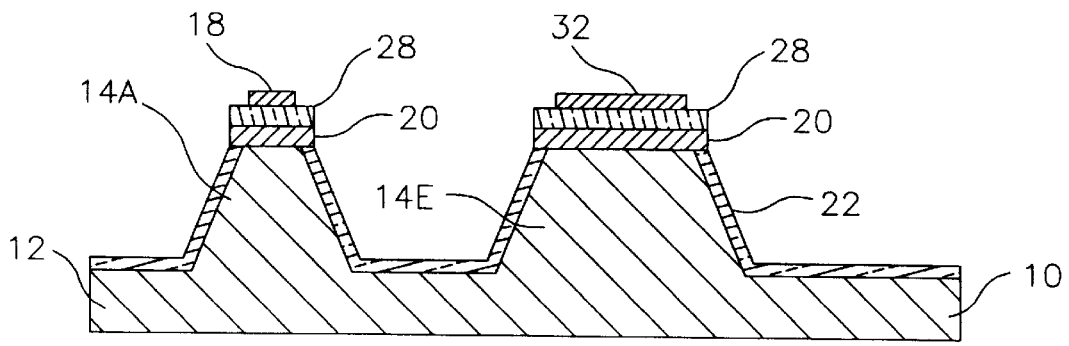

Next, as shown in FIG. 10D, the alignment fiducials 18 can be formed on the alignment features 14A, and the conductive layers 32 can be formed on the alignment features 14E. One suitable material for the alignment fiducials 18 and conductive layers 32 is thin film aluminum. Other suitable materials include titanium (Ti), tungsten (W), tantalum (Ta), platinum (Pt), molybdenum (Mo), cobalt (Co), nickel (Ni), gold (Au), copper (Cu) and iridium (Ir).

The alignment fiducials 18 and conductive layers 32 can be formed using a same metallization process (or alternately different metallization processes). The bonding pads 34 (FIG. 5A) for the conductive layers 32 can also be formed during the same metallization process. The metallization process can comprise blanket deposition of a thin metal film followed by etching through a third resist mask (not shown) using a suitable wet etchant. Preferably the third resist mask comprises a thick film resist adapted to pattern high aspect ratio features, such as the alignment features 14A, 14E. The term "high aspect ratio" means that a height, or depth, of the features is large in comparison to a width, or diameter, of the features.

One suitable resist is a negative tone, thick film resist sold by Shell Chemical under the trademark "EPON RESIN SU-8". This resist also includes an organic solvent (e.g., gamma-butyloracton), and a photoinitiator. The resist can be deposited to a thickness of from about 3–50 mils. A conventional resist coating apparatus, such as a spin coater, or a meniscus coater, can be used to deposit the third resist mask. The deposited resist can then be "prebaked" at about 95° C. for about 15 minutes and then patterned using conventional photolithography techniques.

Thus the invention provides a calibration target for calibrating probe card analyzers and semiconductor wafer test systems, and a method for fabricating the probe card. Although preferred materials have been described, it is to be understood that other materials may also be utilized. Furthermore, although the method of the invention has been described with reference to certain preferred embodiments, as will be apparent to those skilled in the art, certain changes and modifications can be made without departing from the scope of the invention as defined by the following claims.

We claim:

1. A calibration target for a semiconductor wafer test system comprising:
    a substrate;
    an alignment feature comprising a raised member on the substrate having a tip portion and a base portion, the alignment feature including a contrast layer and a fiducial on the tip portion configured for viewing by a viewing device of the test system.

2. The target of claim 1 wherein the wafer test system comprises a probe card analyzer.

3. The target of claim 1 wherein the substrate comprises silicon and the alignment feature comprises an etched member.

4. The target of claim 1 further comprising a second alignment feature on the substrate including a conductive layer configured to electrically engage a contact on a probe card of the test system.

5. A calibration target for a semiconductor wafer test system comprising:
    a substrate;
    a first alignment feature on the substrate comprising a first raised member with a contrast layer and a fiducial thereon configured for viewing by a viewing device of the test system; and
    a second alignment feature on the substrate comprising a second raised member with a conductive layer thereon configured to electrically engage a contact on a probe card of the test system.

6. The target of claim 5 further comprising a plurality of second alignment features on the substrate configured to calibrate a planarity of the probe card.

7. The target of claim 5 wherein the substrate comprises silicon and the first alignment feature and the second alignment feature comprise etched members.

8. The target of claim 5 further comprising a mounting fixture configured to mount the target on a wafer chuck of the test system.

9. The target of claim 5 wherein the contrast layer comprises a reflective metal.

10. The target of claim 5 wherein the first alignment feature has a height with respect to a surface of the substrate of from 50 μm to 150 μm.

11. The target of claim 5 wherein the second alignment feature has a height with respect to a surface of the substrate of from 50 μm to 150 μm.

12. A calibration target for a semiconductor wafer test system comprising:
   a silicon substrate;
   a first alignment feature on the substrate comprising a first etched member having a height of about 50 μm to 150 μm measured from a tip portion thereof to a surface of the substrate, the first alignment feature including a contrast layer and a fiducial on the tip portion configured for viewing by a viewing device of the test system; and
   a second alignment feature on the substrate comprising a second etched member with a conductive layer thereon configured to electrically engage a contact on a probe card of the test system.

13. The target of claim 12 wherein the second alignment feature has a height of about 50 μm to 150 μm measured from the conductive layer to the surface of the substrate.

14. The target of claim 12 wherein the contrast layer comprises a reflective metal.

15. In a semiconductor wafer test system including a probe card and a wafer chuck, a calibration target for calibrating a location of the wafer chuck with respect to the probe card, comprising:
   a substrate;
   a first alignment feature on the substrate having a tip portion and a base portion, the alignment feature including a contrast layer and an alignment fiducial on the tip portion configured for viewing by a viewing device of the test system to calibrate an X axis and a Y axis location of the wafer chuck; and
   a second alignment feature on the substrate including a conductive layer thereon configured to electrically engage a contact on the probe card for calibrating a Z axis location of the wafer chuck.

16. The target of claim 15 further comprising a bond pad in electrical communication with the conductive layer.

17. The target of claim 15 further comprising a third alignment feature on the substrate having a pattern of alignment fiducials thereon.

18. The target of claim 15 wherein the alignment fiducial comprises a member selected from the group consisting of circles, squares and crosses.

19. A method for calibrating a test system for a semiconductor wafer comprising:
   providing the test system with a probe card, a wafer chuck and an alignment system with a viewing device;
   providing a calibration target comprising a substrate with a raised alignment feature including a contrast layer and a fiducial thereon configured for viewing by the viewing device;
   viewing the fiducial and a feature on the probe card using the viewing device; and
   aligning the fiducial with the feature using the alignment system to calibrate an X location and a Y location of the wafer chuck.

20. The method of claim 19 further comprising providing a second alignment feature on the substrate having a conductive layer thereon, and placing the second alignment feature in electrical communication with a contact on the probe card to calibrate a Z location of the wafer chuck.

21. The method of claim 20 further comprising providing a plurality of second alignment features, and placing the plurality of second alignment features in electrical communication with a plurality of contacts on the probe card to calibrate a planarity of the wafer chuck.

22. A method for calibrating a test system for a semiconductor wafer comprising:
   providing the test system with a probe card, a wafer chuck and an alignment system with a viewing device;
   providing a calibration target comprising a substrate with a first alignment feature including a contrast layer and a fiducial thereon configured for viewing by the viewing device, and a second alignment feature including a conductive layer configured for electrical communication with a contact on the probe card;
   viewing the fiducial and a feature on the probe card using the viewing device;
   aligning the fiducial with the feature using the alignment system to calibrate an X location and a Y location of the wafer chuck; and
   placing the conductive layer on the second alignment feature in electrical communication with the contact on the probe card to calibrate a Z location of the wafer chuck.

23. The method of claim 22 wherein the substrate comprises silicon and the first and second alignment features comprise etched pillars.

24. The method of claim 22 further comprising providing a plurality of second alignment features on the substrate and placing conductive layers on the second alignment features in electrical communication with a plurality of contacts on the probe card to evaluate a planarity of the probe card.

25. A method for calibrating a test system for a semiconductor wafer comprising:
   providing the test system with a probe card holder and a wafer chuck;
   providing a calibration target comprising a substrate with an alignment feature including a conductive layer;
   placing a planar calibration plate on the probe card holder or on the wafer chuck;
   placing the calibration target on the wafer chuck or on the probe card holder;
   placing the conductive layer in proximity to the calibration plate;
   measuring a capacitance between the conductive layer and the calibration plate; and
   adjusting a planarity of the wafer chuck or the probe card holder based on the measuring step.

26. A semiconductor wafer test system comprising:
   a probe card having probe contacts configured to electrically engage wafer contacts;
   a wafer chuck configured to move the wafer into electrical engagement with the probe card;
   an alignment system for aligning the wafer chuck with respect to the probe card, the alignment system including a viewing device;
   a calibration target configured for placement on the wafer chuck to calibrate the wafer chuck with respect to the probe card, the target comprising:

a substrate;

a first alignment feature on the substrate having a tip portion and a base portion, the alignment feature including a contrast layer and an alignment fiducial on the tip portion configured for viewing by the viewing device to calibrate an X axis and a Y axis location of the wafer chuck; and a second alignment feature on the substrate including a conductive layer thereon configured to electrically engage a contact on the probe card for calibrating a Z axis location of the wafer chuck.

27. The system of claim 26 wherein the substrate comprises silicon.

28. The system of claim 26 wherein the first alignment feature and the second alignment feature each have a height of from 50 $\mu$m to 150 $\mu$m.

* * * * *